(12) United States Patent
Casper

(10) Patent No.: US 6,614,296 B2
(45) Date of Patent: Sep. 2, 2003

(54) EQUALIZATION OF A TRANSMISSION LINE SIGNAL USING A VARIABLE OFFSET COMPARATOR

(75) Inventor: Bryan K. Casper, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/967,804

(22) Filed: Sep. 28, 2001

(65) Prior Publication Data

US 2003/0016091 A1 Jan. 23, 2003

Related U.S. Application Data

(63) Continuation-in-part of application No. 09/895,625, filed on Jun. 29, 2001, now Pat. No. 6,420,932.

(51) Int. Cl.$^7$ ................................................. H03F 3/45
(52) U.S. Cl. ................ 330/9; 327/307; 703/1; 703/13; 330/258; 330/252; 330/259
(58) Field of Search ................ 703/1, 13; 330/258, 330/9, 252, 259, 308; 327/124, 307; 341/120

(56) References Cited

U.S. PATENT DOCUMENTS

| | | | |
|---|---|---|---|
| 4,639,134 A | * | 1/1987 | Bletz .......................... 330/308 |
| 4,754,169 A | | 6/1988 | Morris |
| 4,987,327 A | | 1/1991 | Fernandez et al. |
| 5,563,598 A | | 10/1996 | Hickling |
| 6,313,769 B1 | * | 11/2001 | Mangahas et al. .......... 341/120 |
| 6,348,882 B1 | | 2/2002 | Ciccone et al. |
| 6,388,521 B1 | | 5/2002 | Henry |
| 6,420,932 B1 | * | 7/2002 | Casper ....................... 330/258 |

FOREIGN PATENT DOCUMENTS

JP          291951          * 11/1993

OTHER PUBLICATIONS

Peralias et al. "A DFT Technique for Analog–to–Digital Converters with Digital Correction" VLSI Test Symposium, 15$^{th}$ IEEE Apr. 27–May 1, 1997 pp 302–307.*

William J. Dally & John W. Poulton, Digital Systems Engineering, Cambridge University Press, 1998, pp. 313–317.

* cited by examiner

Primary Examiner—Michael B Shingleton
(74) Attorney, Agent, or Firm—Blakely, Sokoloff, Taylor & Zafman LLP

(57) ABSTRACT

According to an embodiment, an equalization loop has a comparator with an input to receive a transmission line analog signal level. The comparator has a substantially variable offset that is controllable to represent a variable reference level. An output of the comparator provides a value that represents a comparison between the transmission line analog signal level and the variable reference level.

19 Claims, 8 Drawing Sheets

CREATE AN ELECTRONIC DESIGN AUTOMATION (EDA) REPRESENTATION OF AN EQUALIZATION LOOP IN WHICH A VARIABLE OFFSET COMPARATOR IS USED TO OBTAIN A COMPARISON BETWEEN A TRANSMISSION LINE ANALOG SIGNAL LEVEL AND A VARIABLE REFERENCE LEVEL OF THE COMPARATOR.
804

CREATE A REPRESENTATION OF THE LOOP IN WHICH A FEEDBACK FILTER HAS AN INPUT COUPLED TO THE COMPARATOR OUTPUT AND AN OUTPUT COUPLED TO AN OFFSET CONTROL INPUT OF THE COMPARATOR.
808

FIG. 8

EQUALIZATION OF A TRANSMISSION LINE SIGNAL USING A VARIABLE OFFSET COMPARATOR

This application is a continuation-in-part of U.S. patent application Ser. No. 09/895,625 entitled "Variable Offset Amplifier Circuit" and filed on Jun. 29, 2001 now U.S. Pat. No. 6,420,932.

Some of the subject matter disclosed in the present application may be related to material in the following applications (which are assigned to the same assignee as that of the present application): Ser. No. 09-968,349 entitled "Multi Level Receiver Circuit with Digital Output Using a Variable Offset Comparator" filed on the same date as the present application; Ser. No. 09-967,666 entitled "Voltage Margin Testing of a Transmission Line Analog Signal Using a Variable Offset Comparator in a Data Receiver Circuit" filed on the same date as the present application.

BACKGROUND

This invention is generally related to input/output (i.e., I/O) circuits and in particular to receiver circuits that perform an equalization process to reduce inter-symbol interference when detecting transmitted symbols.

I/O circuits act as the interface between different logic functional units of an electrical system. The functional units may be implemented in separate integrated circuit dies (i.e., IC chips) of the system. These chips may be in separate IC packages that have been soldered to a printed wiring board (i.e., PWB). The chips communicate with each other over one or more conductive transmission lines. The transmission lines may be a parallel bus formed on a PWB, and they may be of the point-to-point or multi-drop variety. Alternatively, the transmission line may be a serial link such as a coaxial cable. In both cases, each chip has an I/O circuit that includes a driver and a receiver for transmitting and detecting symbols. The driver and receiver translate between on-chip signaling and signaling that is suitable for high speed transmission (e.g., at several hundred megabits per second and higher) over a transmission line. In a 'bidirectional link', the driver and receiver pair are connected to the same transmission line.

A problem with high speed transmission is that the non-idealities of the line cause the transmitted signal to be distorted by the time it has reached the receiver. This distortion causes the value of a symbol (which may be a sequence of one or more digital bits) detected by the receiver to not be the same as the symbol value that was transmitted by the driver. This distortion is also known as inter-symbol interference (i.e., ISI), where the effect on the detected symbol may in part be caused by adjacent symbols that were transmitted just before and just after the symbol being detected.

To correct for ISI, a feedback control process known as digital equalization may be used. In such a technique, the received transmission line analog signal is first digitized at a very high sampling rate (which is significantly higher than the bit transmission rate). This digitized signal is then fed one sample at a time to a decision feedback equalizer (i.e., a DFE). The DFE subtracts an estimated, digital correction value from a current sample value of the received signal, to yield a more accurate signal value. This corrected signal value is then translated to a logic value, e.g., '1' or '0', by making a comparison with a reference value. Each estimated correction value is determined by a digital filter, based upon previous comparison output logic values. The characteristics of this filter may be 'adapted', for instance during a training period, so that the comparison output logic values correctly yield the transmitted logic values of a known sequence. That is, the output logic values and the transmitted logic values have been 'equalized'. Thus, the DFE translates a sequence of many digitized samples of a received transmission line analog signal, into a few logic values. This resulting sequence of logic values will define received symbols with improved accuracy, i.e., with lower ISI.

BRIEF DESCRIPTION OF THE DRAWINGS

The invention is illustrated by way of example and not by way of limitation in the figures of the accompanying drawings in which like references indicate similar elements. It should be noted that references to "an" embodiment in this disclosure are not necessarily to the same embodiment, and they mean at least one.

FIG. 8 shows a flow diagram of an embodiment of a computer-implemented method for designing the equalization loop.

DETAILED DESCRIPTION

Figure 1:
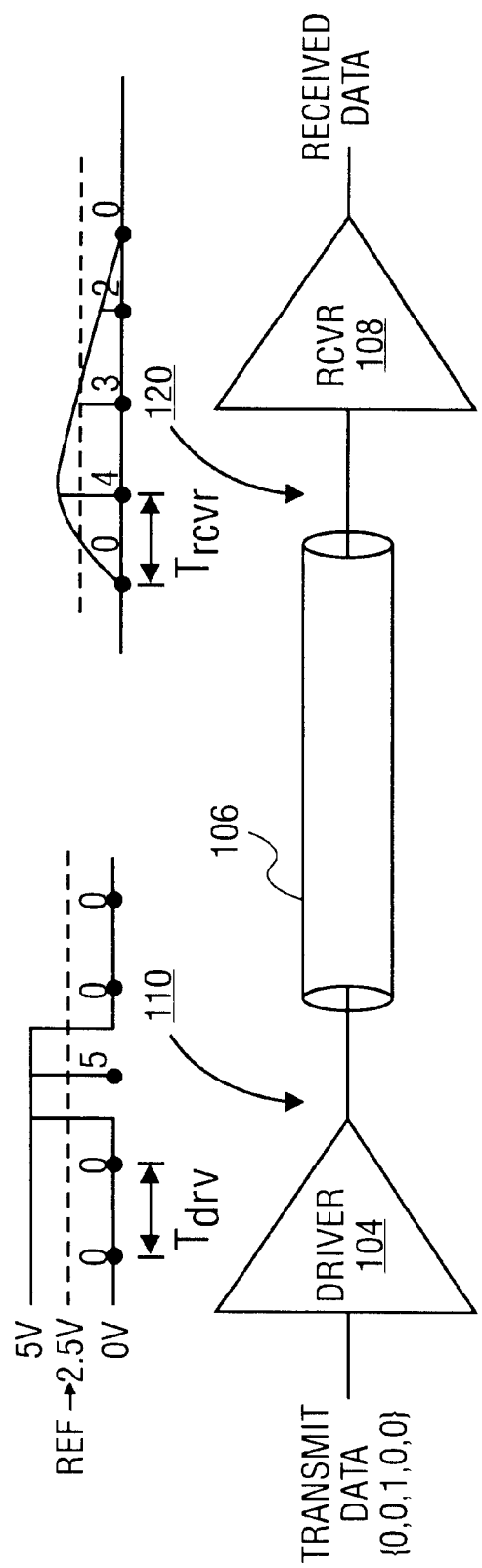
FIG. 1 shows a block diagram of a high speed transmission link used to explain the various embodiments of the equalization loop and process.

An equalization loop and process is described which has the capability of correctly detecting the transmitted logic values at a receiver, and that may be implemented at a lower cost than the conventional, all digital equalization methodology. FIG. 1 will help explain the various embodiments of the equalization loop and process. This figure shows a block diagram of a high speed transmission link that features a far end driver 104 coupled to a near end receiver 108 via a transmission line 106. An exemplary transmit sequence having the logic values {0,0,1,0,0} and timed according to a driver clock period $T_{drv}$ is transmitted as a rectangular transmit pulse 110. Each of the logic values in the sequence may be mapped to a low or high signal level (e.g. 0.0 or 5.0 Volts) in the transmit pulse 110, according to the driver clock. It should be noted that the voltage levels discussed here are merely intended to illustrate the operation of the equalization loop and are not intended to limit the scope of the invention. Those of ordinary skill in the art recognize that a range of signal levels may be used in the operation of the equalization loop. In addition, the examples of the equalization loop and process described below are compatible with binary communication links in which each symbol in the transmitted signal can have one of only two symbolic levels (logic '1' and logic '0'). In general, however, they are compatible with multi-level links. For instance, if a four pulse amplitude modulation (i.e., 4 PAM) link is used, then each symbol can have one of four symbolic levels (e.g., 0, 1, 2, and 3). The embodiment of the equalization loop described below would be modified in that case to have the ability to detect multiple levels in the transmitted analog signal. See U.S. patent application Ser. No. 09/968,349 of Casper, entitled "A Multi-Level Receiver using a Variable Offset Comparator", filed on the same date as the present application, and assigned to the same assignee as that of the present application.

If the transmission line 106 were ideal, then the transmit pulse would arrive undistorted at an input to the receiver 108, after a time delay for traveling the length of the transmission line 106. To recover the logic values, the received transmit pulse 110 could be fed to the input of a comparator (not shown) having a reference level fixed at the midpoint between the low and high signal levels as shown, here 2.5 Volts. The output of the comparator could then be periodically latched, according to a receiver clock period $T_{rcv}$ whose phase and frequency may be locked to that of the driver clock period $T_{drv}$, to recover the transmit sequence {0,0,1,0,0}.

In reality, however, the actual received analog signal 120 is distorted, such as the example shown. This distortion may be due in part to attenuation effects in the practical transmission line 106. It can be seen that using the fixed reference comparator described in the previous paragraph will yield an incorrect sequence {0,1,1,0,0} at the receiver 108.

According to an embodiment of the invention, the correct sequence of logic values may be recovered at the receiver 108 by increasing the reference level from 2.5 Volts to, for example, 4.0 Volts after the third logic value (a '1' in this case) has been latched but before latching the fourth logic value. After latching the fourth logic value, the reference level may be lowered to, for example, 3.0 Volts. Varying the reference level in this manner yields the correct sequence {0,0,1,0,0} for this example.

Figure 2:
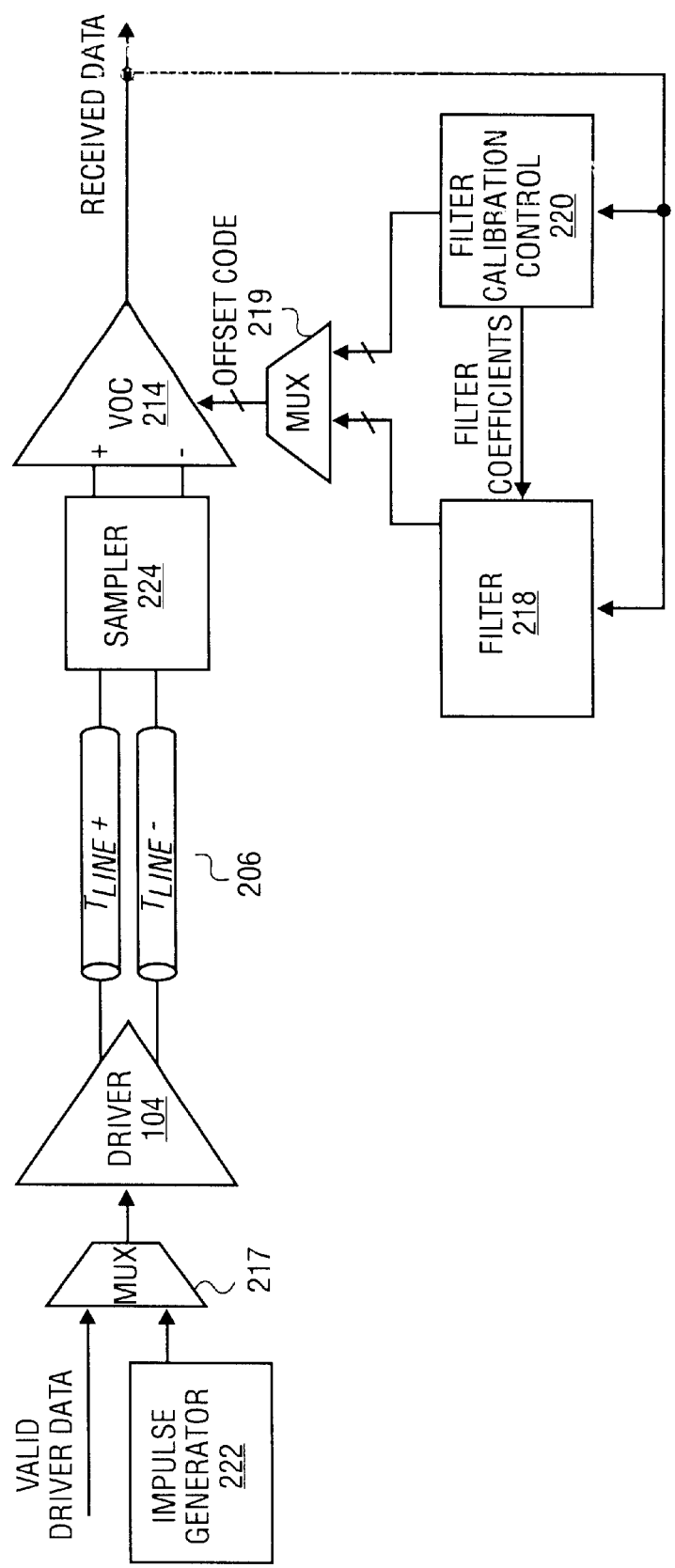
FIG. 2 depicts a block diagram of an embodiment of the equalization loop.

Turning now to FIG. 2, what is shown is an embodiment of an equalization loop that can automatically vary the reference level of a comparator to correctly recover a generalized transmit sequence. Assuming the transmission line 206 can be modeled as a linear time invariant system, the loop as described below can correctly recover a wide range of transmit sequences (including a random sequence) that are linear combinations of a pulse sequence such as, for example, {0,0,1,0,0}. Of course, the loop can alternatively be designed to work with other pulse sequences such as, for example, {0,1,0} or {1,1,0,1,1}.

The loop contains a variable offset comparator (i.e., VOC) 214 whose input is coupled to receive a transmission line analog signal level. In the embodiment shown, the VOC input and the analog signal are differential rather than single ended, to reduce common mode noise. Alternatively, a single ended comparator input coupled to receive a single ended transmission line signal may be used if the application can tolerate the higher common mode noise levels typically associated with single ended operation.

The signal level is compared to a reference level of the VOC 214. According to an embodiment of the equalization loop, the VOC 214 has a substantially variable offset that is controllable to represent the variable reference level. In other words, varying the reference is performed by changing the offset of the VOC 214.

Figure 6:
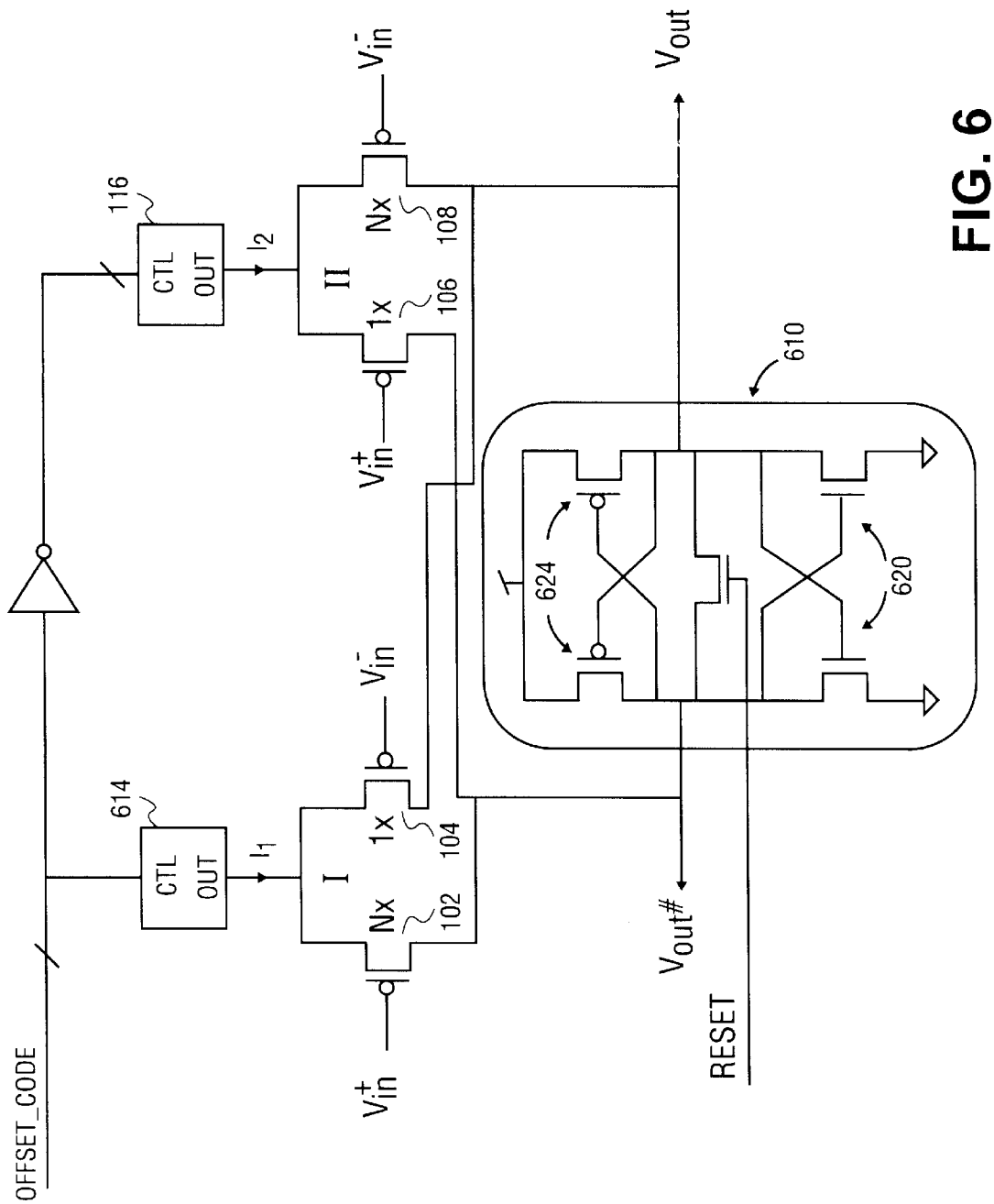
FIG. 6 depicts a circuit schematic of an embodiment of a variable offset comparator used in an embodiment of the equalization loop.

The output of the VOC 214 provides the logic value which, in the case of a binary communication link, is also considered to be the received data as the result of a comparison between the transmission line analog signal level and the variable reference level. An embodiment of the VOC 214 is described in U.S. patent application Ser. No. 09/895,625 of Casper, entitled "Variable Offset Amplifier", filed on Jun. 29, 2001, and assigned to the same assignee as that of the present application. FIG. 6 to be described further below shows a circuit schematic of that VOC.

The equalization loop shown in FIG. 2 further includes a feedback filter 218 whose input is coupled to the VOC output and whose output is coupled to an offset control input of the VOC 214. According to an embodiment, the filter 218 is implemented using a discrete time filter, such as a digital finite impulse response (i.e., FIR) filter. The discrete time filter provides a multi-bit binary value that changes in response to a sequence of logic values that form the received data. In this embodiment, the logic values are provided directly by the output of the comparator 214. The offset code value provided to the VOC 214 may be further modified by other mechanisms added to the receiver. In such cases, the filter output may be added to these other codes to form a resultant offset code value.

The response of a discrete time filter may be determined by its coefficients $a_0$, $a_1$, . . . These may be determined by a filter calibration control unit 220 during a calibration period. During the calibration period, the driver 104 is fed periodic training pulses (generated by a pulse generator 222), rather than valid driver data, through a multiplexer (i.e., mux) 217. The transmitted logic value sequence in a training pulse is known by the calibration control unit 220.

During the calibration period, the filter calibration control unit 220 may need to directly control the offset of the VOC 214 (hence the presence of the mux 219). With the coefficients of the filter 218 being set so that the received data from the VOC output matches the known, transmitted logic values, the loop is ready for normal operation to detect valid driver data.

The filter coefficients are a function of the distortion exhibited by the received transmission line signal. Since this distortion may change over time while the data communication system is in operation, the calibration period may be repeated (relatively infrequently as compared to the period of data transmission) to repeatedly adapt the filter coefficients, and hence the equalization loop, to yield improved and perhaps optimal detection at the receiver.

In the embodiment of FIG. 2, a sampler unit 224 is coupled between the VOC input and the transmission line 206. This sampler unit 224 may be implemented using a sample and hold (i.e., s/h) circuit whose output is to provide the transmission line analog signal level. The sampler unit 224 may be used to reduce jitter in the received data. In such an embodiment, the sampler unit 224 is clocked by a receiver clock signal (not shown) that may be phase and frequency locked to a driver clock signal (not shown). In another embodiment, the sampler unit 224 is not used and the transmission line analog signal is fed directly to the input of the VOC 214. In such a case, the VOC 214 or its latched output may be timed by the receiver clock. According to an embodiment, the driver data is transmitted as synchronized to the driver clock signal, while the received data is detected according to the timing provided by the receiver clock, where the receiver clock is phase and frequency locked to the driver clock. The driver 104 and receiver 108 may be of the source synchronous variety in which a clock or strobe signal is transmitted in synch with the data, and the receiver clock is derived from the received clock or strobe. Other alternatives for timing the detection of the received data are possible.

According to another embodiment, the receiver further includes transmission line termination resistors (not shown) coupled to the transmission line 206 in front of the sampler unit 224. In yet another embodiment electrostatic discharge protection circuitry (not shown) is coupled to the transmission line 206 in front of the sampler unit 224. Other types of circuitry well known to those of ordinary skill in the art may be included in the receiver.

Figure 3:
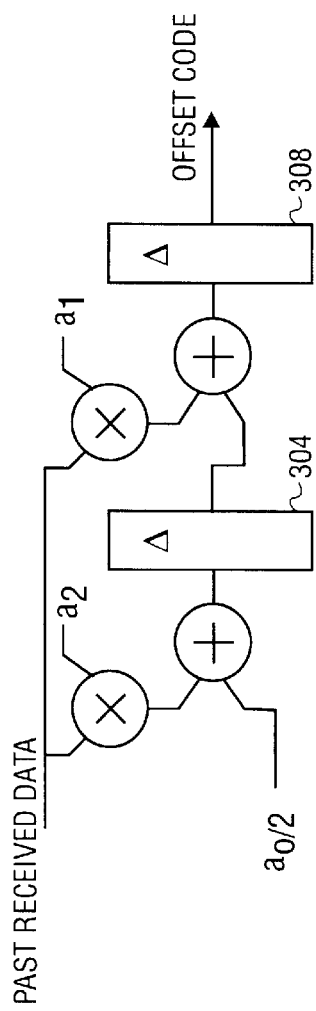
FIG. 3 illustrates a symbolic representation of an exemplary digital filter for use in the equalization loop.

Referring now to FIG. 3, what is shown is a symbolic representation of an exemplary digital FIR filter suitable for use in the equalization loop of FIG. 2. This particular filter design has two delay elements 304 and 308 that can store the results of a linear operation on past received data. Use of this particular filter design can allow the loop to correctly detect the transmitted sequence {0,0,1,0,0} from the distorted received signal shown in FIG. 1. The values of the filter coefficients are selected to be $a_0=4$, $a_1=3$, and $a_2=2$. These were selected in view of the distortion shown in FIG. 1 and the fact that, in this embodiment, the filter output directly represents the offset of the VOC 214. The following table explains operation of the equalization loop in such a case:

| Time Point | Receiver Input | VOC Offset | VOC Comparison | | VOC Output | | Filter Output |
|---|---|---|---|---|---|---|---|
| 1 | 0 | 2 | 0 − 2 = −2 | → | 0 | → | 2 |
| 2 | 4 | 2 | 4 − 2 = +2 | → | 1 | → | 5 |
| 3 | 3 | 5 | 3 − 5 = −2 | → | 0 | → | 4 |
| 4 | 2 | 4 | 2 − 4 = −2 | → | 0 | → | 2 |
| 5 | 0 | 2 | 0 − 2 = −2 | → | 0 | → | 2 |
| 6 | 0 | 2 | 0 − 2 = −2 | → | 0 | → | 2 |

Each row in the table above describes an update to the loop made just after its corresponding time point. The six time points are those shown as being repeated in the periodic pulse signal 404 shown in FIG. 4. The level of the pulse signal 404 at each time point is, in this embodiment, the same as the input signal level of the VOC in the receiver (see FIG. 2). It can be seen from the table above that the selected filter coefficients indeed cause the VOC output to yield the correct sequence.

Referring back to the table above, note how the difference between the level at the receiver input and the effective reference level of the VOC is in all cases equal to 2. This difference is known here as the 'voltage margin' at the input to the VOC. This voltage margin as determined from the table is symmetrical, i.e., the voltage margin is the same for logic '1' as well a logic '0' at the VOC output. The voltage margin is a measure of how much noise in the analog transmitted signal can be tolerated by the receiver, before the receiver output yields the wrong symbol value.

If the voltage margin at the input to the VOC as measured during the filter calibration period were to remain the same thereafter during normal operation of the receiver, then the coefficients of the filter 218 (see FIG. 2) once calibrated would remain optimal. However, the voltage margin may change during normal operation, due to environmental factors such as increased attenuation at one end versus another end of the transmission line analog signal range, as well as due to other factors. To keep the voltage margin symmetrical under such circumstances, the filter coefficients could be adapted to maintain the symmetry by, for instance, periodically detecting the voltage margin and in response, using for example a least mean square algorithm, modifying the filter coefficients to obtain the desired voltage margin and symmetry.

Figure 4:
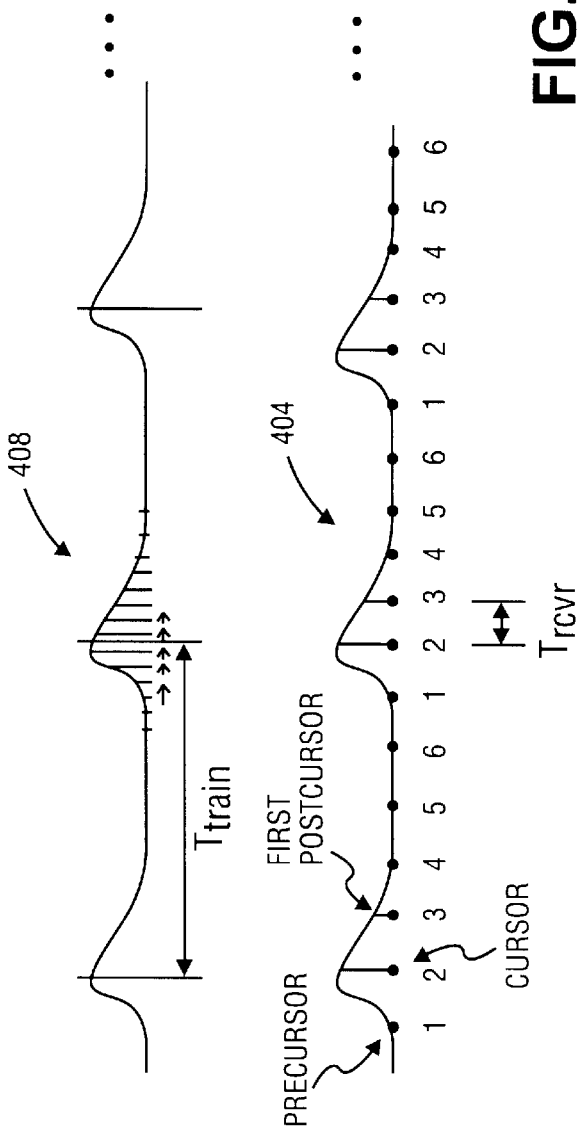
FIG. 4 shows a pair of periodic pulse signals generated during a calibration procedure for the equalization loop.

In the above described embodiments, what has been assumed is that the receiver can generate correctly positioned periodic time points, in which one of them is referred to as the 'cursor' as shown in FIG. 4. In addition, to determine the filter coefficients, knowledge of the signal level values at the cursor as well as at the post- and pre-cursors may be needed (see FIG. 4). Accordingly, FIG. 5 illustrates a flow diagram of an embodiment of a process for digitizing a received pulse that is being periodically repeated, for determining the cursor, post-cursor, and pre-cursor (if any) levels.

Figure 5:
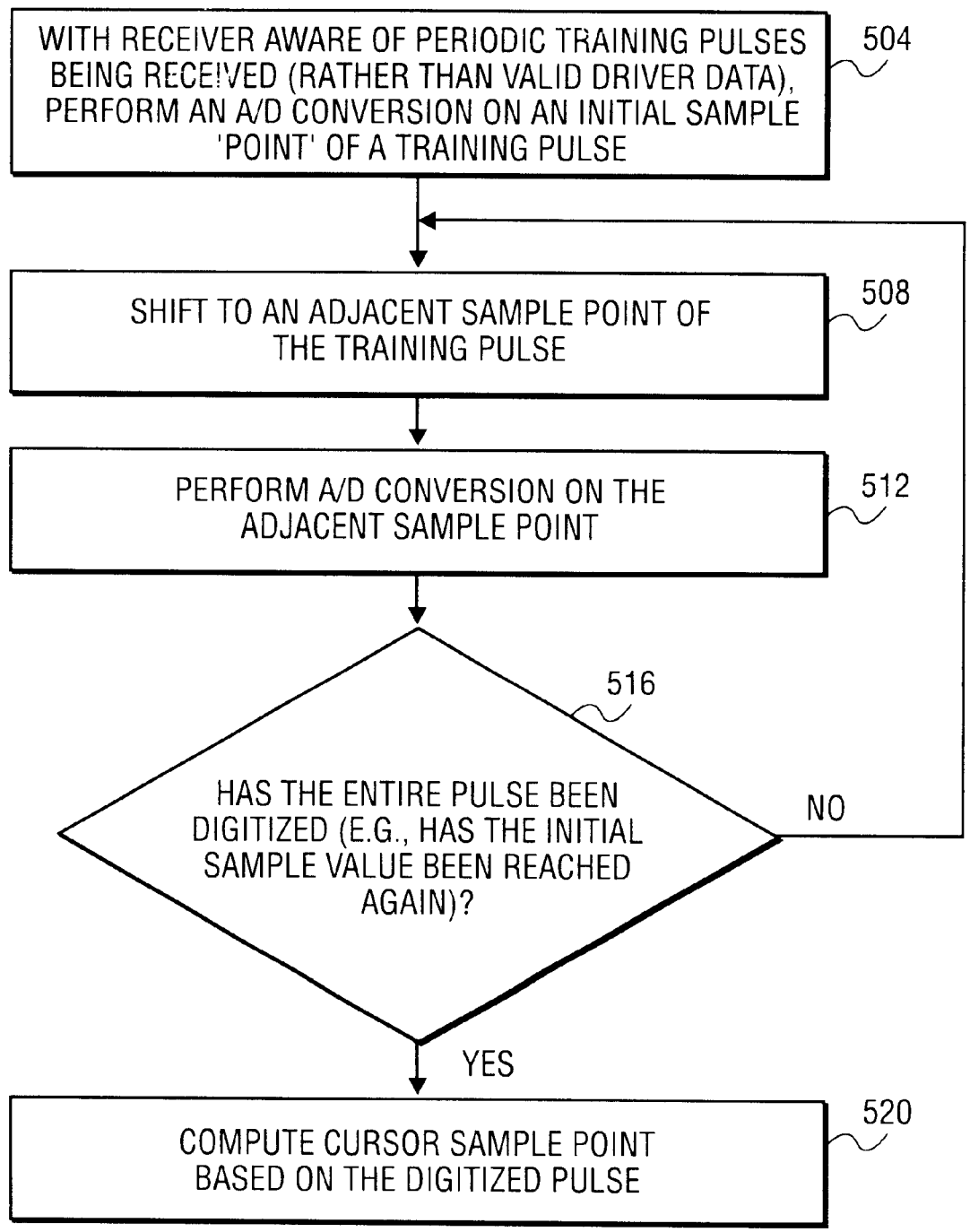
FIG. 5 illustrates a flow diagram of an embodiment of a process for determining the cursor level used in the equalization loop.

Referring to FIG. 5 and to the periodic training pulses as part of a pulse signal 404 shown in FIG. 4, the system can be designed so that the receiver is aware that periodic pulses, rather than valid driver data, are being received. The periodic pulses should be sufficiently spaced apart in time to allow the transmission line to settle (e.g., to allow reflections of a pulse to die out) before each subsequent pulse is transmitted. An analog to digital (A/D) conversion is performed on an initial sample point, having a non-zero signal level, of a training pulse (operation 504). This may be done by the receiver itself, using the VOC as connected in FIG. 2, according to a successive approximation A/D converter process. Alternatively, other A/D conversion procedures may be used, including those that are performed by a dedicated, off-chip integrated circuit test system rather than an on-chip A/D conversion technique in the receiver. The process continues with operation 508.

In operation 508, a shift is performed to an adjacent sample point of the training pulse. The spacing between adjacent sample points may be as indicated by the row of small arrows under the pulse signal 408 of FIG. 4. The spacing should be small enough so that the pulse is sufficiently digitized to yield useful signal levels. After shifting to the adjacent sample point, the A/D conversion is repeated for that new sample point (operation 512). Operations 508 and 512 are repeated until the entire training pulse has been digitized (operation 516). One way to decide when the entire pulse has been digitized is when the digitized signal level of the pulse has returned to its initial value computed in operation 504.

Once the pulse has been digitized in its entirety, the cursor may be determined as follows (operation 520). For example, the time point having the maximum (absolute value) digitized level in the received training pulse may be selected to be the cursor. Alternatively, the cursor may be selected as the time point at which the following relationship is satisfied for the digitized pulse:

maximum of {cursor_level−Σ|precursor_levels|+ Σ|postcursor_levels|}

A cursor selected according to this relationship is also known as an 'eye-opening' of the particular receiver. Note that the cursor computed using the above relationship is not necessarily the same as the time point at which the signal level of the pulse is at its maximum. Other techniques for determining the cursor may be possible. In some cases, it may be necessary to perform statistical processing on the digitized pulse data, over a number of pulses for example, to obtain a better estimate of the cursor location.

Once the cursor has been selected for the training pulse, the post-cursors and pre-cursors (if any) can also be readily identified based on a receiver clock period $T_{rcvr}$ (see FIG. 4, pulse 404). According to an embodiment, these values can also be used to compute the coefficients of the digital FIR filter shown in FIG. 3, where $a_0$=the cursor level, $a_1$=the first post-cursor level, and $a_2$=the second post-cursor level.

Note that the pulse 120 shown in FIG. 1 is referred to as one that only has post-cursor ISI, because the pre-cursor signal levels are zero. The above-described embodiments also work to correctly detect received pulses that have pre-cursor ISI as well, namely those in which the pre-cursor signal levels are non-zero. If pre-cursor ISI is expected in the received signal, e.g., if the signal level at the first time point in the pulse 120 were non-zero, then the $a_0$ coefficient of the digital FIR filter may be modified by those of ordinary skill in the art so that the correct logic value (in this example, '0') is still detected.

According to an embodiment, once the cursor has been determined during the calibration period, the phase of the receiver clock is re-adjusted according to the cursor and then continues to be kept locked to that of the driver clock. In addition, once the calibration period is over, the driver clock should not drastically change its phase or frequency prior to starting the transmission of valid data, if doing so might throw the receiver clock out of lock. Other techniques for clocking the receiver and the driver are possible.

FIG. 6 depicts a circuit schematic of an embodiment of the VOC 214. The comparator circuit includes an amplifier circuit including first and second differential pairs which are defined by transistors 102, 104 and 106, 108, respectively. Variable current generators 114 and 116 are also coupled to control the tail currents $I_1$ and $I_2$ to the respective differential pairs. These current generators 114, 116 are controlled by a digital value known as the 'offset code' (see FIG. 2) that is received on multiple, offset select lines as shown. In this embodiment, each digital value of the offset corresponds to two oppositely varying tail currents $I_1$ and $I_2$ that are equidistant from a nominal tail current.

A single ended output voltage for this comparator may be available as either $V_{out}$ or $V_{out}\#$. To drive these output signals into one of two possible stable states, a regenerative load circuit 610 is provided as shown. After being reset by an input signal, this regenerative load circuit 610 will quickly amplify any difference between $V_{out}$ and $V_{out}\#$, where such amplification occurs at a relatively high gain due to the cross coupled n-channel pair 620 and p-channel pair 624, thereby ensuring that the output signals $V_{out}$ and $V_{out}\#$ only assume one of two possible stable states. Thus, if $V_{in}^+$ is greater than $V_{in}^-$ by at least the amount of offset that has been selected (as referred back to the input of the differential pairs), then the regenerative latch circuit 610 forcefully drives $V_{out}$ to a low voltage level and simultaneously drives $V_{out}\#$ to a high voltage level. Other types of regenerative latch circuits may be used to provide the digital type output signal typically associated with a sense amplifier or a comparator application.

Figure 6B:
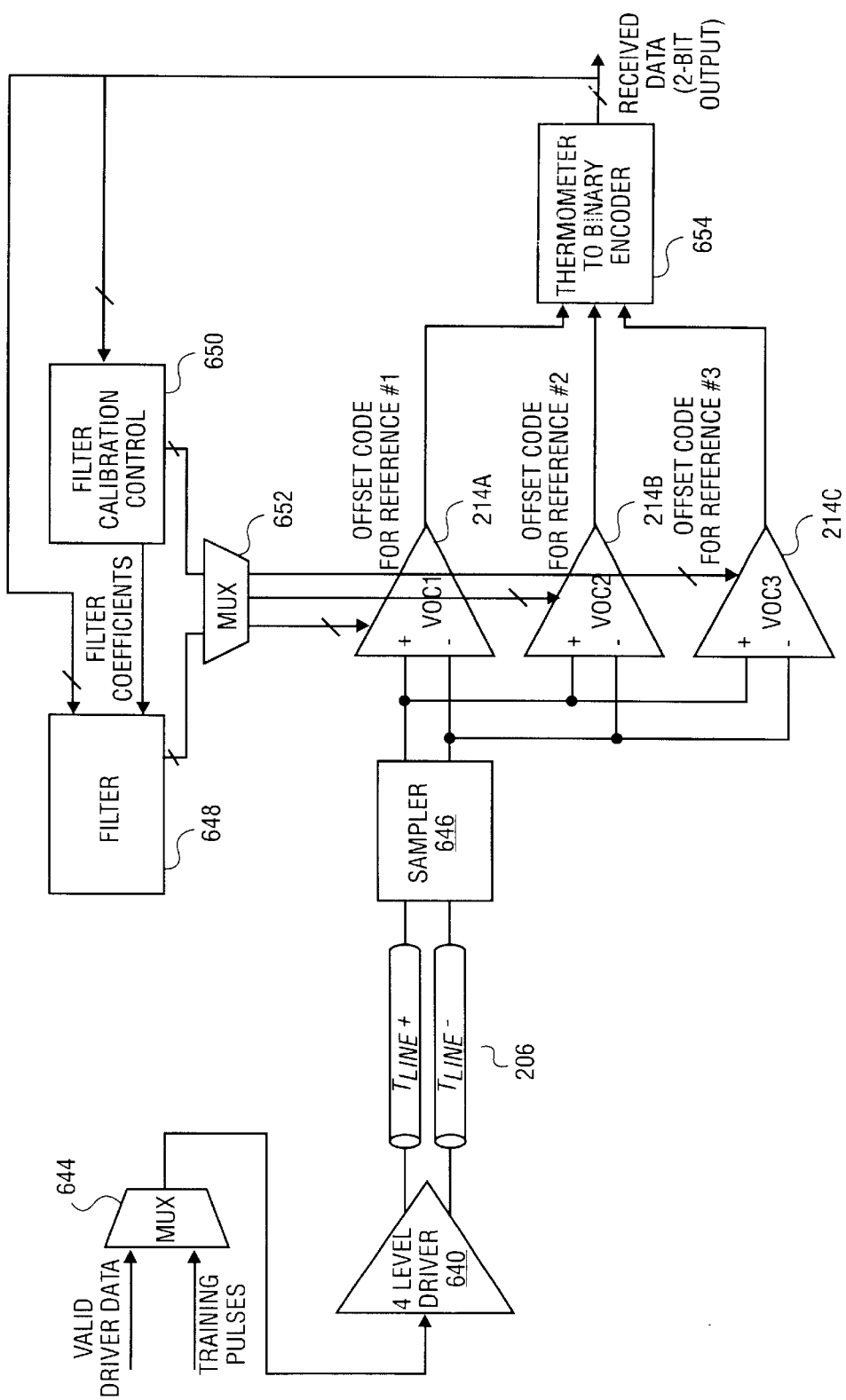
FIG. 6b illustrates a block diagram of a high speed transmission link featuring a multi-level receiver in which an equalization loop is implemented.

Turning now to FIG. 6b, what is shown is a block diagram of a high speed transmission link featuring a multi-level receiver in which an equalization loop is implemented. The multi-level receiver includes in this embodiment 3 VOCs 214a, 214b, and 214c that are designed to detect the symbols of a 4 pulse amplitude modulation (i.e. 4 PAM) link. As in the embodiment of FIG. 2, a sampler 646 may be provided to help reduce jitter in the received data. This 4 PAM multi-level receiver may be reference calibrated as described in U. S. patent application Ser. No. 09-968,349 entitled "Multi-Level Receiver Circuit With Digital Output Using a Variable Offset Comparator" of Casper, filed on the same date as the present application. Once the three reference levels have been calibrated, the multi-level receiver may be permitted to detect 4 PAM amplitude modulated data symbols, as described in the just identified application. These symbols have been transmitted by a four level driver 640 that has been fed by the output of a multiplexer (i.e., MUX) 644 with valid driver data. A filter 648 whose coefficients are determined by a filter calibration control unit 650 are also provided to automatically control the offset code for each VOC, based on received data provided by a three bit to two bit thermometer encoder 654. A multiplexer 652 is provided to allow the offset for each VOC 214 to be controlled by either the filter 648 during normal operation, or by the filter calibration control unit 650 during a filter calibration procedure in which the filter coefficients are determined. Once again, assuming the transmission line 206 can be modeled as a linear timed invariant system, the loop as shown in FIG. 6b can correctly recover a wide range of transmit sequences (including a random sequence) that are linear combinations of a set of pulse sequences such as, for example, {0,0,1,0,0} {0,0,2,0,0} and {0,0,3,0,0}. Of course, the loop can alternatively be designed to work with other shorter or longer pulse sequences.

During a filter calibration period, the driver 640 is fed periodic training pulses, rather than valid driver data, through the MUX 644. During the filter calibration period, the filter calibration control unit 650 may directly control the offset of each VOC 214 (hence the presence of the MUX 652). As recognized by one of ordinary skill in the art, the above described operations of determining the filter coefficients for the binary receiver embodiment (FIGS. 1–5) may be modified to obtain filter coefficients that allow a bank of digital FIR filters (as part of the filter 648) to automatically control the variable offset of each VOC 214 so that a generalized sequence of multibit symbols may be accurately detected in the presence of distortion caused by travel through the transmission line 206.

Figure 7:
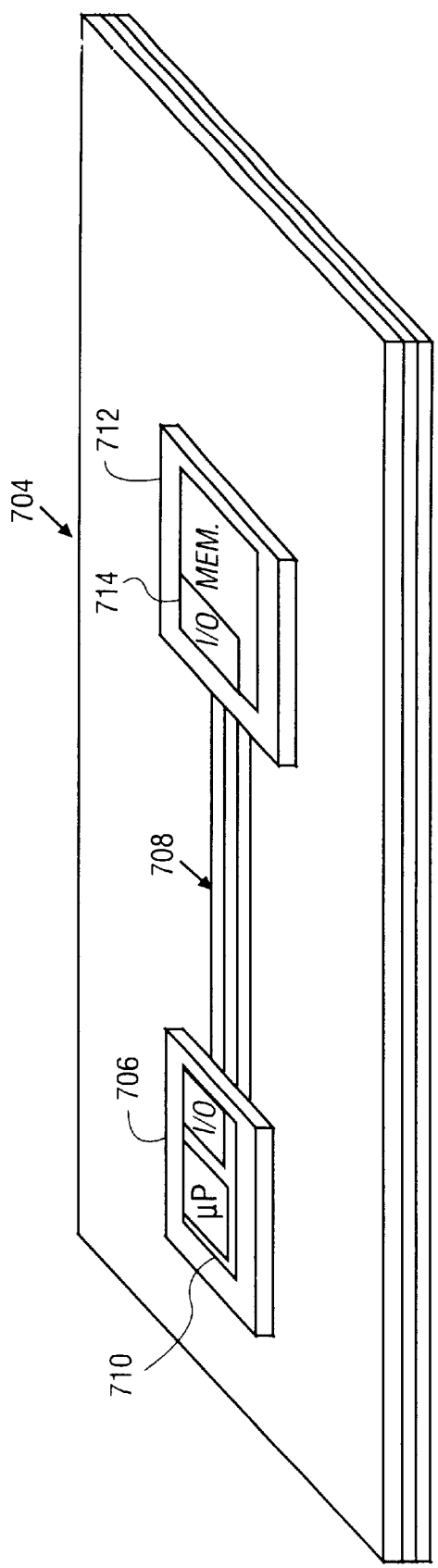
FIG. 7 depicts a block diagram of an embodiment of an electronic system in which a communication link features the equalization loop.

Turning now to FIG. 7, what is shown is a block diagram of an embodiment of an electronic system in which a communication link features the equalization loop described above. The system has a multi-layer printed wiring board 704 on which a parallel bus 708 is formed. The bus 708 may be of the point to point variety, or a multi-drop bus such as those used in a main memory. An integrated circuit (IC) chip package 706 is operatively installed on the board to communicate using the parallel bus 708. The installation of the package 706 may be done by a surface mount technique or via a connector or socket. The package has an IC chip 710 that includes a logic function section, and an I/O section as an interface between the logic function section and the bus 708. The logic function suction may be one of the following well-known devices: a microprocessor, a memory controller, and a bus bridge. Alternatively, other devices that can be implemented in the logic function section of an IC chip may be used. The I/O section has a bus receiver in which an equalization loop as described above is provided.

A second IC package 712 is also installed on the board 704 to communicate with the first package 706 via the bus 708. The second IC package 712 also includes a chip 714 having an I/O section in which a bus receiver is provided to interface the bus 708, and its own logic function section (here shown as a memory controller).

According to an embodiment, the I/O interfaces of the two chips 710 and 714 communicate with each other bi-directionally, that is using the same conductive lines of the bus for both transmitting and receiving data. Thus, in such an embodiment, drivers are provided, in both IC chips, that are connected to the same conductive lines of the bus 708. Other system applications of the equalization loop are possible, including, for example, a cable receiver.

Referring now to FIG. 8, what is shown is a flow diagram of an embodiment of a computer-implemented method for designing the equalization loop. The various embodiments of the loop described above may be designed using conventional computer-aided design and electronic design automation tools. The method involves the creation of a representation of the loop in which a comparator has an input to receive the transmission line analog signal level (operation 804). The comparator has a substantially variable offset that is controllable to represent a variable reference level. An example of such a comparator was described above in connection with FIG. 6. The representation of the loop is understood to provide at the output of the comparator a value that represents a comparison between the transmission line analog signal level and the variable reference level.

The method also includes creating a representation of a feedback filter for the loop, where an input of the feedback filter is coupled to the comparator output. An output of the feedback filter is coupled to an offset control input of the comparator (operation 808). As was mentioned above, representation of the feedback filter may be, for instance, as a digital FIR filter whose output is coupled to provide the offset code for the comparator.

In general, the representations of all embodiments described above may be created using conventional computer-aided design and electronic design automation tools that are well known to those of ordinary skill in the art. After the representation of the loop has been created, it may be stored in digital form, as part of, for instance, a hardware description language file in a fixed or portable computer memory device, such as a hard disk drive or a compact disc. This file contains instructions that, when executed by a machine such as a computer work station, cause the machine to display and perhaps simulate operation of the equalization loop as part of a larger system.

To summarize, various embodiments of an equalization loop and process have been described that can be implemented in a relatively low cost manner. The lower cost may be a result of one or more of the following, including no need for A/D conversion during normal operation of the loop, and relatively low power and chip area usage due to the inherent design of the equalization loop. For instance, the digital FIR filter may be implemented with multipliers that are implemented by one stage of logic gates, in the case of a binary communication link. In the case of a multilevel communication link, the multipliers would be slightly more complex but could nevertheless be implemented as, for instance, 4 to 1 multiplexers in the 4 PAM case.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A circuit comprising:
an equalization loop in which a comparator has an input to receive a transmission line analog signal level, the comparator having a substantially variable offset that is controllable to represent a variable reference level, an output of the comparator to provide a value that represents a comparison between the transmission line analog signal level and the variable reference level.

2. The circuit of claim 1 wherein the equalization loop further includes a feedback filter whose input is coupled to the comparator output and whose output is coupled to an offset control input of the comparator.

3. The circuit of claim 2 wherein the feedback filter includes a digital finite impulse response filter whose output is coupled to the offset control input of the comparator.

4. The circuit of claim 2 wherein the offset control input of the comparator is to receive a multi-bit binary value.

5. The circuit of claim 4 wherein the feedback filter includes a digital finite impulse response filter to provide the multi-bit binary value to the offset control input.

6. The circuit of claim 1 further comprising:
a sample and hold circuit whose output is to provide the transmission line analog signal level.

7. The circuit of claim 2 wherein the comparator includes first and second differential transistor pairs each being intentionally unbalanced, each pair having first and second output nodes, the first output node of the first pair being coupled to the second output node of the second pair, the second output node of the first pair being coupled to the first output node of the second pair, and first and second variable current generators coupled to control respective tail currents of the first and second differential pairs.

8. A computer-implemented method for designing an equalization loop, comprising:
creating an electronic design automation (EDA) representation of an equalization loop in which a comparator has an input to receive a transmission line analog signal level, the comparator having a substantially variable offset that is controllable to represent a variable reference level, an output of the comparator to provide a value that represents a comparison between the transmission line analog signal level and the variable reference level.

9. The method of claim 8 further comprising:
creating an EDA representation of a feedback filter whose input is coupled to the comparator output and whose output is coupled to an offset control input of the comparator.

10. The method of claim 9 wherein the representation of the feedback filter includes a digital finite impulse response filter whose output is coupled to the offset control input of the comparator.

11. The method of claim 9 wherein the representation of the comparator includes first and second differential transistor pairs each being intentionally unbalanced, each pair having first and second output nodes, the first output node of the first pair being coupled to the second output node of the second pair, the second output node of the first pair being coupled to the first output node of the second pair, and first and second variable current generators coupled to control respective tail currents of the first and second differential pairs.

12. An electronic system comprising:
a printed wiring board on which a parallel bus is formed, an integrated circuit (IC) chip package being operatively installed on the board to communicate using the parallel bus, the package having an IC chip that includes a logic function section and an I/O section as an interface between the logic function section and the bus, the I/O section having a bus receiver in which an equalization loop includes a comparator that has an input to receive a parallel bus signal level, the comparator having a substantially variable offset that is controllable to represent a variable reference level, an output of the comparator to provide a value that represents a comparison between the parallel bus analog signal level and the variable reference level.

13. The electronic system of claim 12 wherein the logic function section is a microprocessor.

14. The electronic system of claim 12 wherein the logic function section is a memory controller.

15. The electronic system of claim 12 wherein the logic function section is a bus bridge.

16. An article of manufacture comprising:

a machine-readable medium having instructions stored thereon which, when executed by a processor, cause an electronic system to display a representation of an equalization loop in which a comparator has an input to receive a transmission line analog signal level, the comparator having a substantially variable offset that is controllable to represent a variable reference level, an output of the comparator to provide a value that represents a comparison between the transmission line analog signal level and the variable reference level.

17. The article of manufacture of claim 16 wherein the medium includes further instructions which, when executed by the processor, cause the system to display a representation of a feedback filter whose input is coupled to the comparator output and whose output is coupled to an offset control input of the comparator.

18. The article of manufacture of claim 17 wherein the representation of the feedback filter includes a digital finite impulse response filter whose output is coupled to the offset control input of the comparator.

19. The article of manufacture of claim 17 wherein the representation of the comparator includes first and second differential transistor pairs each being intentionally unbalanced, each pair having first and second output nodes, the first output node of the first pair being coupled to the second output node of the second pair, the second output node of the first pair being coupled to the first output node of the second pair, and first and second variable current generators coupled to control respective tail currents of the first and second differential pairs.

* * * * *